United States Patent [19]

Lin

[11] 4,456,499
[45] Jun. 26, 1984

[54] DOUBLE CRUCIBLE CZOCHRALSKI CRYSTAL GROWTH METHOD

[75] Inventor: Wen Lin, Ewing Township, Mercer County, N.J.

[73] Assignee: AT&T Technologies, Inc., New York, N.Y.

[21] Appl. No.: 400,570

[22] Filed: Jul. 22, 1982

Related U.S. Application Data

[62] Division of Ser. No. 042,693, May 25, 1979, Pat. No. 4,352,784.

[51] Int. Cl.³ .................. C30B 15/04; C30B 15/12
[52] U.S. Cl. ................................ 156/605; 156/608
[58] Field of Search .......... 156/608, 617 SP, DIG. 83, 156/DIG. 64, 605; 422/249, 253

[56] References Cited

U.S. PATENT DOCUMENTS

| 2,892,739 | 6/1959 | Rusler | 148/1.5 |
| 3,025,191 | 3/1962 | Levertor | 156/605 |
| 3,198,606 | 8/1965 | Lyons | 422/249 |
| 3,206,286 | 9/1965 | Bennett et al. | 422/249 |
| 3,567,397 | 3/1971 | O'Hara | 422/119 |
| 3,627,499 | 12/1971 | Le Duc et al. | 156/609 |
| 3,637,439 | 1/1972 | De Bie | 156/608 |
| 3,755,011 | 8/1973 | Kleinknecht | 148/171 |
| 4,203,951 | 5/1980 | Goriletsky et al. | 156/608 |

FOREIGN PATENT DOCUMENTS 49-44870 11/1974 Japan ........................ 156/608

OTHER PUBLICATIONS

Valcic, Solid-State Electronics, 1960 V5 pp. 131–134.
Jl. of Applied Physics, V29 No. 8, 8158 Leverton.

Primary Examiner—Hiram H. Bernstein
Attorney, Agent, or Firm—J. F. Spivak

[57] ABSTRACT

An apparatus useful for double crucible Czochralski crystal growth comprises an inner crucible fixed within an outer crucible wherein the inner crucible contains an extra volume or reservoir of semiconductor melt when flow of semiconductor melt from the outer crucible into the inner crucible through means interconnecting the crucibles ceases.

5 Claims, 5 Drawing Figures

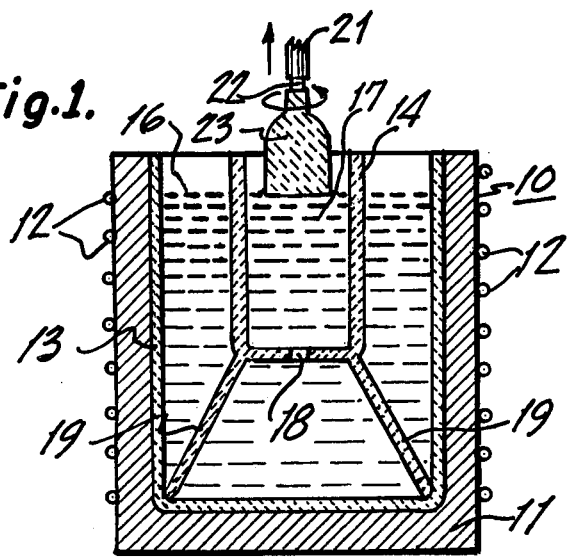
Fig.1.
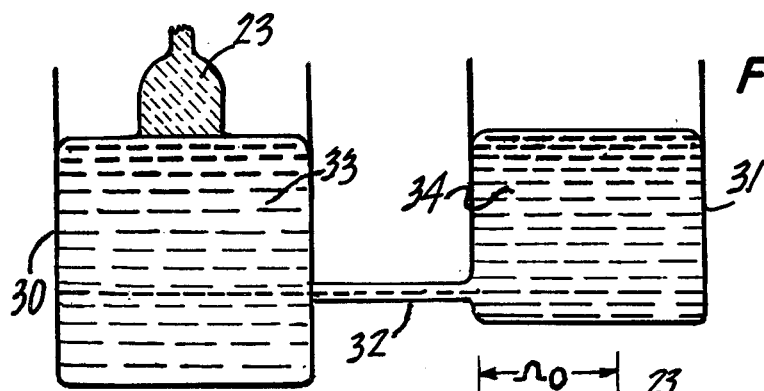
Fig.2.
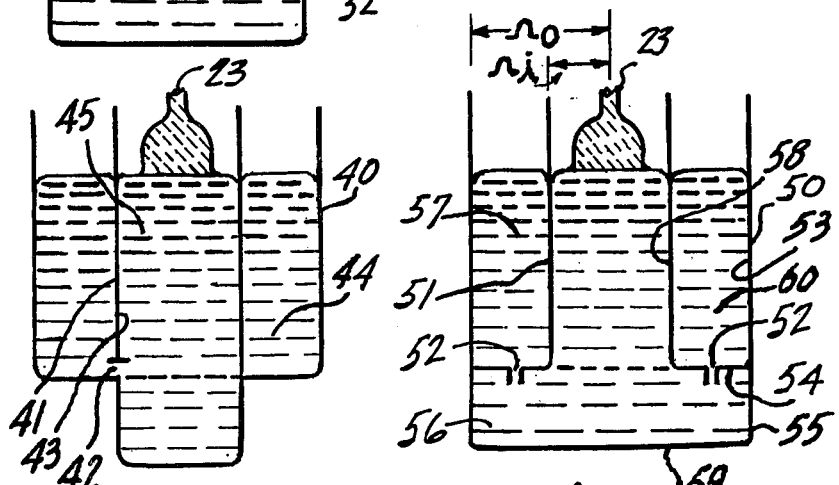
Fig.3.
Fig.4.

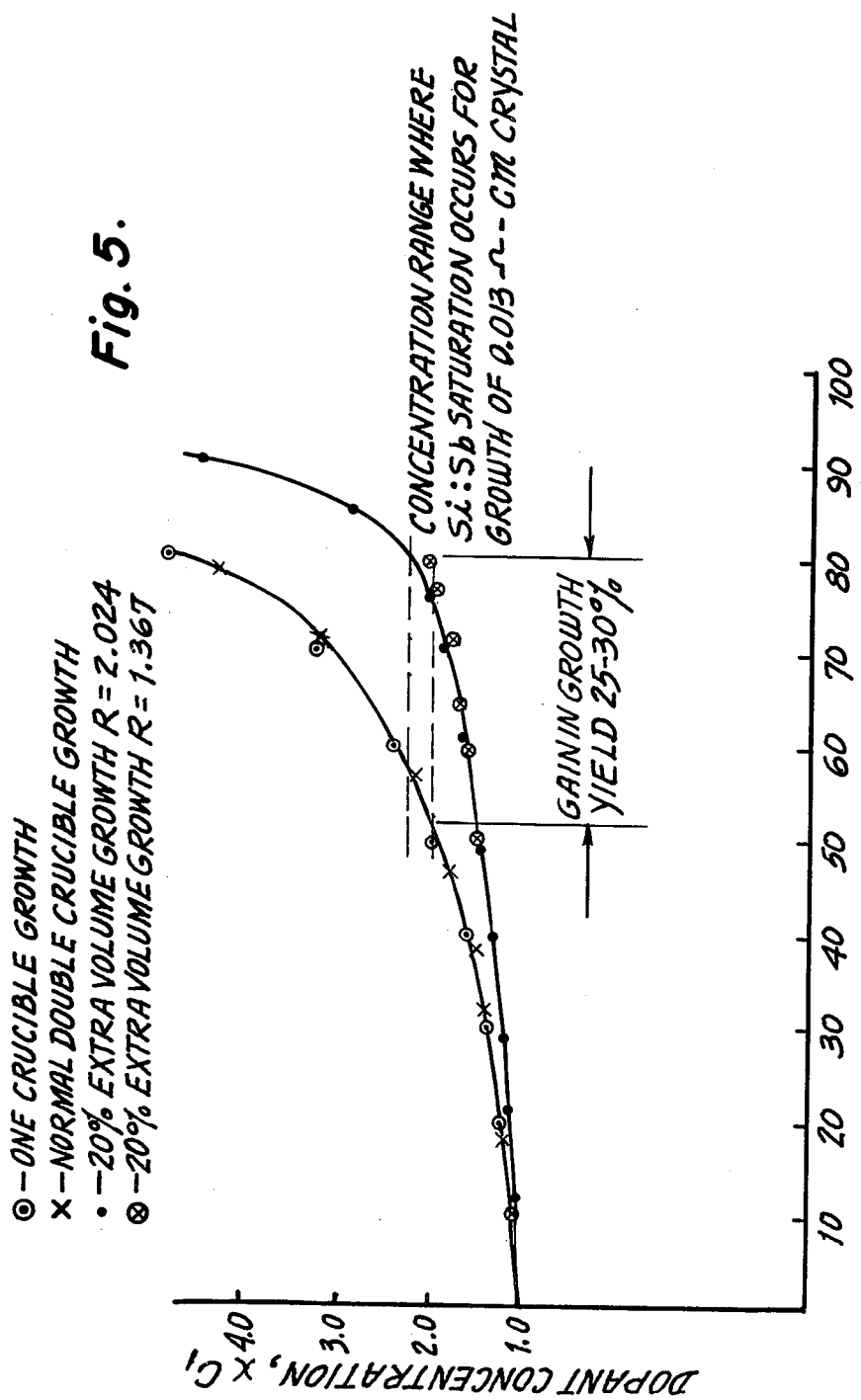

DOUBLE CRUCIBLE CZOCHRALSKI CRYSTAL GROWTH METHOD

This is a division of application Ser. No. 042,693 filed May 25, 1979, now U.S. Pat. No. 4,352,784, issued Oct. 5, 1982.

TECHNICAL FIELD

This invention is directed to a method of producing semiconductor single crystal material using the Czochralski process. In particular, the method employs the use of a first and second crucible having an interconnecting channel to permit the flow of semiconductor melt therebetween.

BACKGROUND OF THE INVENTION

It is well known to produce semiconductor single crystal material using the Czochralski technique by forming a melt of the crystal material and bringing a seed crystal into contact with the melt. The seed is then pulled slowly upwards, the molten material solidifying at the seed-melt interface, thus forming a single crystal billet as the seed is continued to be pulled slowly upwards. Alternatively, of course, the billet can be formed by maintaining the seed in a fixed position while slowly lowering the melt relative to the position of the seed.

While such a method has been found to be quite effective, the crystal produced suffers from non-uniform electrical resistivity along its length. This is primarily due to the fact that the doping agents (e.g., arsenic, antimony, gallium or indium) commonly added to the pure semiconductor material (e.g., silicon, germanium), are more soluble in the liquid semiconductor material than in the solidifying or solid crystal. Hence, in a growing crystal, the concentration of doping agent in the melt keeps increasing as the crystal is pulled from the melt. This steadily increasing concentration of doping agent remaining in the melt also results in an increase of dopant and hence a decrease in resistivity along the length of the grown crystal billet as well as eventual saturation of the dopant in the melt. This saturation then results in the precipitation of a separate phase from the melt, which in turn provides nucleation sites for polycrystalline growth, thereby interfering with the continued, desired, single crystal growth. The problem of saturation and polycrystalline formation is especially significant in the growth of a heavily doped crystal wherein the dopant has a high segregation behavior.

The aforementioned problems have been addressed by a technique known as the double crucible method for Czochralski crystal growth. Generally, this method of pulling crystals from a melt employs an inner crucible from which the crystal is pulled, which inner crucible is positioned within an outer crucible containing a reservoir of material supplied to the inner crucible through an orifice connecting the two crucibles. This double crucible technique is employed to control the dopant concentration of the melt by, for example, providing a melt of relatively high concentration of dopant in the inner crucible and one of lesser dopant concentration or dopant-free material in the outer crucible. As the crystal is being pulled from the inner crucible, the lower concentration material of the outer crucible passes through the orifice connecting the crucibles and enters the inner crucible thereby maintaining a uniform dopant concentration in the inner crucible. This method is specifically suitable for the growth of crystals wherein the dopant is significantly more soluble in the melt than in the solid grown crystal. An example of such a crystal is antimony doped silicon. In Czochralski growth of such a crystal, as the crystal is being pulled from the melt, only a small percentage of the dopant enters the growing crystal while the remaining melt normally would tend to become more and more concentrated with dopant. However, with the use of a reservoir in the outer crucible which consists of a melt containing a low dopant concentration or a dopant-free melt which enters the inner crucible through the connecting orifice and replaces the amount of melt removed from the crucible by the growing crystal, one can approximately maintain the initial concentration of dopant in the inner crucible melt.

Notwithstanding the advantages gained by the use of double crucible techniques as opposed to the original single crucible Czochralski growth technique, it has been found that in the growth of certain crystals, such as heavily antimony doped silicon, e.g., on the order of $4 \times 10^{18}$ atoms/cc, that while a relatively uniform resistivity of the billet can be achieved, typically only about 50-60% of the initial total charge of melt material can be pulled into a single crystal before polycrystalline growth is observed. It is therefore desirable to provide a method for pulling crystals of this kind in which substantially more than 50-60% of the initial charge is useful, thereby allowing the growth of larger crystals and further increasing the efficiency and economics of the crystal growth process. I have discovered that an important parameter in dealing with the aforementioned problem of limited useful melt charge is that of the relative ratios of the volumes of the inner crucible to the outer crucible as compared to the ratios of the cross-sectional areas of these crucibles. In the prior art double crucible apparatus, the ratio of the primary areas of the inner and outer crucibles as compared to the ratio of the volumes of the respective crucibles are generally either identical or the area ratio is greater than the volume ratio. This can be seen, for example, with reference to U.S. Pat. No. 2,892,739.

SUMMARY OF THE INVENTION

The instant apparatus overcomes the foregoing problem by incorporating my discovery that if an "extra volume" of melt is provided in the inner crucible, as much as 75-80% of the total melt can be employed before polycrystalline growth is observable. The instant apparatus comprises an inner crucible and an outer crucible such that the ratio of the volume of the inner crucible to the volume of the outer crucible is greater than the ratio of the primary cross-sectional areas of the respective crucibles. As previously stated, in conventional double crucible designs, the ratio of the volume of the melt of the inner crucible to that of the outer crucible is generally equal to or sometimes less than the ratios of the areas of the respective crucibles.

It should be noted that the term inner crucible and outer crucible are used for convenience so as to relate the subject invention to the prior art. The inner crucible in actuality need not lie fixed or floating within the melt of the outer crucible but may be separated from the outer crucible provided an interconnection exists between what is termed the outer crucible and the inner crucible so as to allow melt to flow from the outer crucible to the inner crucible in a quantity essentially sufficient to replace the melt lost from the inner crucible by the growing crystal.

BRIEF DESCRIPTION OF THE DRAWINGS

FIG. 1 is an elevational cross-sectional view depicting a typical prior art double crucible apparatus used in Czochralski crystal growth;

FIGS. and 2, 3 and 4 are elevational views depicting alternative double crucible apparatus in accordance with the instant invention; and FIG. 5 is a graphical representation comparing the percent of melt solidified before polycrystalline growth for various crucible configurations with respect to dopant concentration.

DETAILED DESCRIPTION

The instant invention will be described with reference to particular exemplary embodiments, each of which have one commonality. That is, each of the embodiments shown employ first and second chambers for containing molten semiconductor material which chambers are interconnected with a communicating channel therebetween so that the melt from the second chamber flows into the first chamber and wherein the crystal is pulled from the first chamber. Another commonality of each of the embodiments is that the first chamber contains what is termed herein an "extra volume." Another way to describe this extra volume is where the ratio of the volume of the first chamber to that of the second chamber is greater than the ratio of the primary area of the first chamber to the primary area of the second chamber. It should be understood that the particular embodiments shown are for purposes of exposition and not for limitation. Various other embodiments are contemplated which also maintain the aforesaid commonality.

The extra volume referred to is that volume which remains in the inner crucible after exchange of melt material from the outer crucible is no longer possible. It is generally the volume or capacity of the inner crucible which lies below the interconnection tube which provides a channel of flow between the crucibles.

Referring to FIG. 1, there is depicted a prior art double crucible Czochralski semiconductor crystal growing apparatus, generally indicated by the numeral 10. The crystal apparatus 10 is comprised of a housing 11 (e.g., graphite) surrounded by a series of high frequency induction coils 12. An outer crucible 13 is seated within the housing 11 and an inner crucible 14 is shown suspended in a first semiconductor melt 16 within the outer crucible 13. A second melt 17 is present within the inner crucible 14. The first melt 16 within the outer crucible 13 is a melt of semiconductor material having a first dopant concentration level and the second melt 17, within the inner crucible 14, is a melt of the same semiconductor material having a second dopant concentration level. The inner crucible 14 is fixedly mounted within the outer crucible 13 by means of supports 19. When growing crystals, such as antimony doped silicon, in which the dopant is much more soluble in the melt than in the pulled crystal, the dopant concentration level in the first melt 16 in the outer crucible 13 may vary from zero to a level which is lower than the dopant concentration level of the second melt 17 in the inner crucible 14. An orifice or channel 18 is provided in the bottom of the inner crucible 14 so as to permit flow of the melt 16 into the inner crucible 14. It should be observed that the inner and outer crucibles are typically essentially uniformly cylindrical in shape such that the ratio of the volume of the inner crucible to the outer crucible is less than the ratio of the cross-sectional areas of the inner crucible to the outer crucible cross-sectional area. If the length of the inner crucible were extended to the bottom of the outer crucible, and the orifice was at or near the bottom of the inner crucible, the aforementioned ratios would essentially be equal. These relationships can be shown mathematically as follows: Where $V_o$ represents the volume of the melt in the outer crucible; $V_i$ represents the volume of the melt in the inner crucible; $r_o$ represents the radius of the outer crucible; $r_i$ represents the radius of the inner crucible; $h_o$ represents the height of the melt within the outer crucible; $h_i$ represents the height of the melt within the inner crucible; and where the thickness of the inner crucible walls are small as compared to $r_i$ and $h_i$ $$V_o = \pi r_o^2 h_o - \pi r_i^2 h_i$$

$$V_i = \pi r_i^2 h_i$$

$$A_o = \pi r_o^2 - \pi r_i^2$$

$$A_i = \pi r_i^2$$

$$\frac{A_i}{A_o} = \frac{r_i^2}{r_o^2 - r_i^2} \quad \frac{V_i}{V_o} = \frac{r_i^2 h_i}{r_o^2 h_o - r_i^2 h_i}$$

Where the inner crucible extends to or near the bottom of the outer crucible $h_i \approx h_o$ and $$\frac{V_i}{V_o} = \frac{A_i}{A_o}$$

In the case where $h_i < h_o$ (and $r_i < r_2$), that is where the inner crucible height is less than the outer crucible height, $$\frac{V_i}{V_o} < \frac{A_i}{A_o}.$$

In operation, a rotating pull rod 21 holding a single crystal semiconductor seed 22 causes the seed to contact the surface of the melt 17 in the inner crucible 14 and the pull rod 21 is moved upward to draw a single crystal semiconductor billet 23 from the melt 17. As the single crystal semiconductor billet 23 is being drawn from the inner crucible melt 17, portions of the outer crucible melt 16 pass through the opening 18 into the inner crucible 14 to (1) replenish the melt used to form the crystal billet 23 and (2) maintain the dopant concentration in the melt 17 substantially constant by diluting the higher dopant concentration in the crucible melt 17 with the lower concentration melt 16 in the outer crucible.

Although the above process operates effectively, it has been found using prior art fixed crucible configurations that only 50-60% of the melt can be used before polycrystalline growth occurs.

FIGS. 2, 3 and 4 depict a crystal growing apparatus exemplary of the instant invention. In the embodiment shown in FIG. 2 the double crucible approach to Czochralski crystal growth is applied without the use of an inner and outer crucible but rather with two separate crucibles which are analogous to the inner and outer crucibles. While the apparatus shown in FIG. 2 may not be the most practical apparatus for employing the novel invention, it is a viable apparatus and serves as an easy illustration of the instant invention. The apparatus as shown in FIG. 2 comprises a first crucible 30 which is analogous to the inner crucible in the prior art double crucible growth apparatus and a second crucible 31 which is analogous to the outer crucible of the prior art double crucible growth apparatus. The lower portion of crucible 31 is connected to crucible 30 at a point above the lower portion of crucible 30 by an interconnecting tube 32 which allows semiconductor melt material from crucible 31 to flow into crucible 30. Crucible 30 contains a semiconductor melt material 33 having a predetermined desired dopant concentration while the semiconductor melt 34 contained in crucible 31 contains no dopant or a dopant concentration less than that of semiconductor melt material 33. Gravity causes the melt material in crucibles 30 and 31 to reach the same level above the interconnect tube 32. As the crystal is pulled in the usual fashion from the melt 33 in crucible 30, semiconductor melt material 33 in crucible 30 is depleted and semiconductor melt material 34 from crucible 31 flows through interconnecting tube 32 into crucible 30 to compensate for the loss of material in crucible 30 and maintaining an essentially even concentration of dopant within the semiconductor melt of crucible 30 by diluting the melt 33 which would otherwise tend to become more and more concentrated in dopant as the crystal is pulled. When the level of melt material in the crucibles falls to the level of the interconnecting tube 32, flow of melt from crucible 31 into crucible 30 ceases. As can be seen in the design of the novel apparatus, a quantity or volume of melt still remains in the crucible 30 from which the crystal is pulled. This volume is termed the "extra volume" of the inner crucible. The extra volume is shown as that volume below the dotted line across crucible 30. It can be seen that in this instance the ratio of the volume of crucible 30 to the volume of crucible 31 is greater than the ratio of the respective cross-sectional areas of the crucibles. Hence $$\frac{V_i}{V_o} > \frac{A_i}{A_o}.$$

The crucible system depicted in FIG. 3 comprises an outer crucible 40, an inner crucible 41 positioned within and spaced from the walls of the outer crucible 40, and at least one interconnecting orifice 42, typically capillary in size, in the wall 43 of the inner crucible 41. The orifice 42 permits flow of semiconductor melt 44 contained in outer crucible 40 to inner crucible 41 as semiconductor melt 45 contained in the inner crucible 41 is depleted by the formation of the single crystal billet 23 pulled therefrom. The wall 43 of inner crucible 41, which is generally cylindrically shaped, extends downwardly through and past the bottom of the outer crucible 40. The orifice 42 is preferably located adjacent and immediately above the line where the bottom of the outer crucible 40 meets the wall 43 of the inner crucible 41. In this configuration almost all of the melt 44 can pass from the outer crucible 40 to the inner crucible 41 before flow ceases. The volume of the inner crucible 41 below the orifice 42 is the extra volume previously referred to. This is the volume of semiconductor melt remaining in the inner crucible when melt transfer from the outer crucible ceases. It can readily be seen that in the embodiment depicted in FIG. 3, the ratio $$\frac{V_i}{V_o} > \frac{A_i}{A_o}$$

where $V_i$ and $A_i$ represent the volume and area respectively of the inner crucible and $V_o$ and $A_o$ represents the useful volume and primary area of the outer crucible.

Another embodiment of the invention is depicted in FIG. 4. In this embodiment there is also an outer crucible 50, an inner crucible 51 and at least one, preferably capillary size, orifice 52 interconnecting the crucibles 50 and 51. The outer crucible 50 has a cylindrical crucible wall 53 which extends beyond the bottom 54 of the outer crucible 50. This wall extension 55 is the outer wall of the lower portion 56 of the inner crucible 51 which has a larger diameter than the diameter of the upper portion 57 of the inner crucible 51. The inner crucible 51 is formed by an upper portion wall 58 which meets with and then becomes coextensive or shared with the bottom 54 of the outer crucible 50. The inner crucible 51 is closed at its lower end by a bottom wall 59 which lies below the bottom 54 of the outer crucible. The upper portion of the inner crucible wall 58 is spaced from and centered within the outer crucible wall 53. The orifices 52, as shown, are located in the bottom wall 54 and allow for flow of semiconductor melt 60 in the outer crucible into the lower portion of the inner crucible 51. Alternatively, the orifice may be in the vertical portion of the inner crucible wall, preferably at a point or points where the vertical wall becomes coextensive with the bottom of the outer crucible.

In this configuration, the primary area of the inner crucible is that area above the orifice 52. The primary area of the outer crucible is, as is the case in the embodiment of FIG. 2, the area of the outer crucible adjacent the inner crucible primary area, that is, the difference between $\pi r_o^2$ and $\pi r_i^2$ where $r_o$ is the radius of the outer crucible and $r_i$ is the radius of the inner crucible. The extra volume of the inner crucible is the volume of the lower portion of the inner crucible (the portion below the bottom wall 54 of the outer crucible) since this is the volume remaining after flow of melt from the outer crucible ceases. Again, as can be seen, $$\frac{V_i}{V_o} > \frac{A_i}{A_o}$$

where volumes are total volumes and areas are primary areas.

It has been found that even heavily doped crystals, e.g., heavily Sb doped Si, pulled from double crucible configurations such as shown in the above-described novel embodiments where $$\frac{V_i}{V_o} > \frac{A_i}{A_o}$$

or where an extra volume exists, can result in use of as much as 80% or more of the total semiconductor melt before encountering polycrystalline crystal formation, thereby making the overall process more economical.

I have discovered that the benefit derived by the extra volume where $X < (1-x)$ can be expressed or shown mathematically from the following general equation $$C_1(X) = \left(1 - \frac{X}{1+Rx}\right)^{k(1+R)-1} \left[C_1{}^i - \frac{C_2 R}{k(1+R)-1}\right] + \frac{C_2 R}{k(1+R)-1}$$

where:
- $C_1(X)$ is the dopant concentration in the inner crucible at any point in time;
- $k$ is the segregation coefficient of the dopant between solid and melt;
- $R$ is the ratio of the primary area of the outer crucible (or equivalent) to the primary area of the inner crucible (or equivalent);
- $x$ is the ratio of the extra volume to the total melt volume of the two chambers;
- $X$ is the ratio of the solidified or billet volume to the total melt volume;
- $C_1{}^i$ is the initial dopant concentration in the inner crucible; and
- $C_2$ is the dopant concentration in the outer crucible.

In the special situation where there is no dopant in the outer crucible, i.e., $C_2 = 0$, then $$C_1(X) = \left(1 - \frac{X}{1+Rx}\right)^{k(1+R)-1} [C_1{}^i].$$

Also when $X > (1-x)$ the governing expression is $$C_1(X) = C_1(1-x)\left[\frac{1-X}{x}\right]^{k-1}.$$

Utilizing the above equations, FIG. 5 has been determined for normal single crucible Czochralski crystal growth, normal straight wall double crucible (no extra volume) Czochralski crystal growth and novel extra volume apparatus Czochralski crystal growth. The Figure is a plot of percent melt solidified before polycrystalline growth against the dopant concentration in the melt plotted as the multiple of the initial dopant concentration. The particular plots were made for an antimony doped silicon melt used for the growth of a 0.013 ohm-cm. silicon crystal wherein the graph for normal double crucible growth is based upon a nominal 10 inch diameter outer crucible and a 6 inch diameter inner crucible, where $R = 1.786$. The graphs for the novel extra volume growth are based upon a 20% extra volume using a double crucible design as shown in FIG. 3. In one instance, the graph represents a plot for a double crucible having a nominal 10 inch outer crucible diameter and a 6 inch inner crucible diameter and in the other instance the graph represents a plot for a double crucible having a 10 inch outer crucible diameter and a 6.5 inch inner crucible diameter where $R = 1.367$.

It can readily be seen from the graphs that with a 20% extra volume as defined herein, approximately 80% of the total melt is useful before saturation of silicon with antimony, and hence, before the growth of polycrystalline silicon.

What is claimed is:

1. A process for growing a doped single crystal ingot from a melt contained in a concentrically positioned pair of crucibles, said crucibles at least the top portion of which are spaced from each other being interconnected in a manner which allows the passage of melt from the outer concentric crucible to flow into the inner crucible as melt material is removed from the inner crucible and wherein melt remains in a reservoir portion of the inner crucible after inner crucible melt flow ceases, including the steps of:
   (a) contacting a seed crystal with the surface of the melt in the inner concentric crucible;
   (b) pulling the seed crystal from the melt so as to form single crystal growth on the seed crystal;
   (c) providing a flow of melt from the outer concentric crucible to the inner crucible through crucible flow interconnection means to continuously replace melt material removed from the inner crucible during crystal growth; and
   (d) continuing to pull the crystal from the melt contained in the inner crucible after the flow of melt from the outer crucible to the inner crucible ceases.

2. The process recited in claim 1 including the steps of introducing solid semiconductor material to each crucible and heating said crucibles to form a melt.

3. The process recited in claim 2 wherein said semiconductor material is silicon.

4. The process recited in claim 3 wherein an antimony dopant is used with said silicon.

5. The process recited in claim 1 wherein at least 60% of the total melt volume is pulled into ingot form before polycrystalline growth is observed.

* * * * *